United States Patent
Uenaka et al.

(10) Patent No.: US 8,912,060 B2
(45) Date of Patent: Dec. 16, 2014

(54) METHOD FOR MANUFACTURING SEMICONDUCTOR DEVICE AND APPARATUS FOR MANUFACTURING SAME

(75) Inventors: Tsuneo Uenaka, Mie-ken (JP); Kazuyuki Higashi, Kanagawa-ken (JP)

(73) Assignee: Kabushiki Kaisha Toshiba, Tokyo (JP)

(*) Notice: Subject to any disclaimer, the term of this patent is extended or adjusted under 35 U.S.C. 154(b) by 1127 days.

(21) Appl. No.: 12/725,662

(22) Filed: Mar. 17, 2010

(65) Prior Publication Data
US 2011/0031546 A1    Feb. 10, 2011

(30) Foreign Application Priority Data

Aug. 6, 2009  (JP) ................. 2009-183070

(51) Int. Cl.
*H01L 29/788*   (2006.01)
*H01L 21/20*   (2006.01)
*H01L 29/66*   (2006.01)
*H01L 27/115*   (2006.01)
*H01L 29/792*   (2006.01)
*H01L 21/28*   (2006.01)

(52) U.S. Cl.
CPC .... *H01L 27/11578* (2013.01); *H01L 29/66833* (2013.01); *H01L 29/7926* (2013.01); *H01L 21/28282* (2013.01); *H01L 29/792* (2013.01); *H01L 27/11582* (2013.01); *H01L 27/11573* (2013.01)
USPC ............ 438/257; 438/618; 438/666; 438/591

(58) Field of Classification Search
USPC ............... 438/618–666, 257–274, E29.3, 591
See application file for complete search history.

(56) References Cited

U.S. PATENT DOCUMENTS

| | | | |
|---|---|---|---|
| 6,541,861 B2 | 4/2003 | Higashi et al. | |
| 7,232,748 B2 * | 6/2007 | Ali | ................ 438/618 |
| 2007/0252201 A1 | 11/2007 | Kito et al. | |

FOREIGN PATENT DOCUMENTS

| | | |
|---|---|---|
| JP | 2000-208616 | 7/2000 |
| JP | 2007-266143 | 10/2007 |

OTHER PUBLICATIONS

U.S. Appl. No. 13/603,616, filed Sep. 5, 2012, Yahashi.
Japanese Office Action issued Jan. 5, 2012, in Patent Application No. 2009-183070 (with English-language translation).

* cited by examiner

Primary Examiner — Cuong Q Nguyen
(74) Attorney, Agent, or Firm — Oblon, Spivak, McClelland, Maier & Neustadt, L.L.P.

(57) ABSTRACT

A method for manufacturing a semiconductor device includes: forming a first layer on a substrate; forming a first contact hole in the first layer; burying a sacrificial film in the first contact hole; forming a second layer on the first layer and the first contact hole after burying; forming a second contact hole reaching the sacrificial film in the second layer; removing the sacrificial film from the first contact hole via the second contact hole; and providing a contact electrode in the first contact hole and the second contact hole.

13 Claims, 16 Drawing Sheets

METHOD FOR MANUFACTURING SEMICONDUCTOR DEVICE AND APPARATUS FOR MANUFACTURING SAME

CROSS-REFERENCE TO RELATED APPLICATIONS

This application is based upon and claims the benefit of priority from the prior Japanese Patent Application No. 2009-183070, filed on Aug. 6, 2009; the entire contents of which are incorporated herein by reference.

BACKGROUND

A technology for three-dimensionally arranging memory cells is proposed in, for instance, JP-A 2007-266143. In this technology, a plurality of conductive layers functioning as control gates in a memory device are stacked alternately with insulating layers to form a stacked body. Memory holes are formed therein, and a charge storage layer is formed on the inner wall of the memory hole. Then, silicon is provided in the memory hole. This technology provides a configuration in which the conductive layers cover the columnar silicon at prescribed intervals and a memory cell is formed at the intersection of each of the conductive layers and the silicon pillar. Stacking a large number of conductive layers enables a large memory capacity.

In the case where the number of stacked layers of the stacked body increases, the aspect ratio of a contact hole that pierces the stacked body to reach the substrate increases. It causes an increase in the difficulty level of the processing for the contact hole formation.

SUMMARY

According to an aspect of the invention, there is provided a method for manufacturing a semiconductor device including: forming a first layer on a substrate; forming a first contact hole in the first layer; burying a sacrificial film in the first contact hole; forming a second layer on the first layer and the first contact hole after burying; forming a second contact hole reaching the sacrificial film in the second layer; removing the sacrificial film from the first contact hole via the second contact hole; and providing a contact electrode in the first contact hole and the second contact hole.

According to another aspect of the invention, there is provided a semiconductor device including: a substrate; a stacked body provided on the substrate and including a plurality of conductive layers and a plurality of insulating layers alternately being stacked, the stacked body including a contact hole, the contact hole including a first contact hole reaching the substrate and a second contact hole formed on the first contact hole to be connected to the first contact hole and having a smaller hole diameter than the first contact hole; and a contact electrode provided in the contact hole formed in the stacked body.

According to still another aspect of the invention, there is provided a semiconductor device including: a substrate including a memory cell array region and a peripheral circuit region formed around the memory cell array region; a stacked body provided on the substrate over the memory cell array region and the peripheral circuit region and including a plurality of conductive layers and a plurality of insulating layers alternately stacked; a semiconductor layer provided in a memory hole formed in the stacked body in the memory cell array region and aligning in a stacking direction of the conductive layers and the insulating layers; a charge storage layer provided between the conductive layers and the semiconductor layer; and a contact electrode provided in a contact hole formed in the stacked body in the peripheral circuit region, the contact hole including: a first contact hole reaching the substrate; and a second contact hole formed on the first contact hole to be connected to the first contact hole and having a smaller hole diameter than the first contact hole.

DETAILED DESCRIPTION

Figure 1:
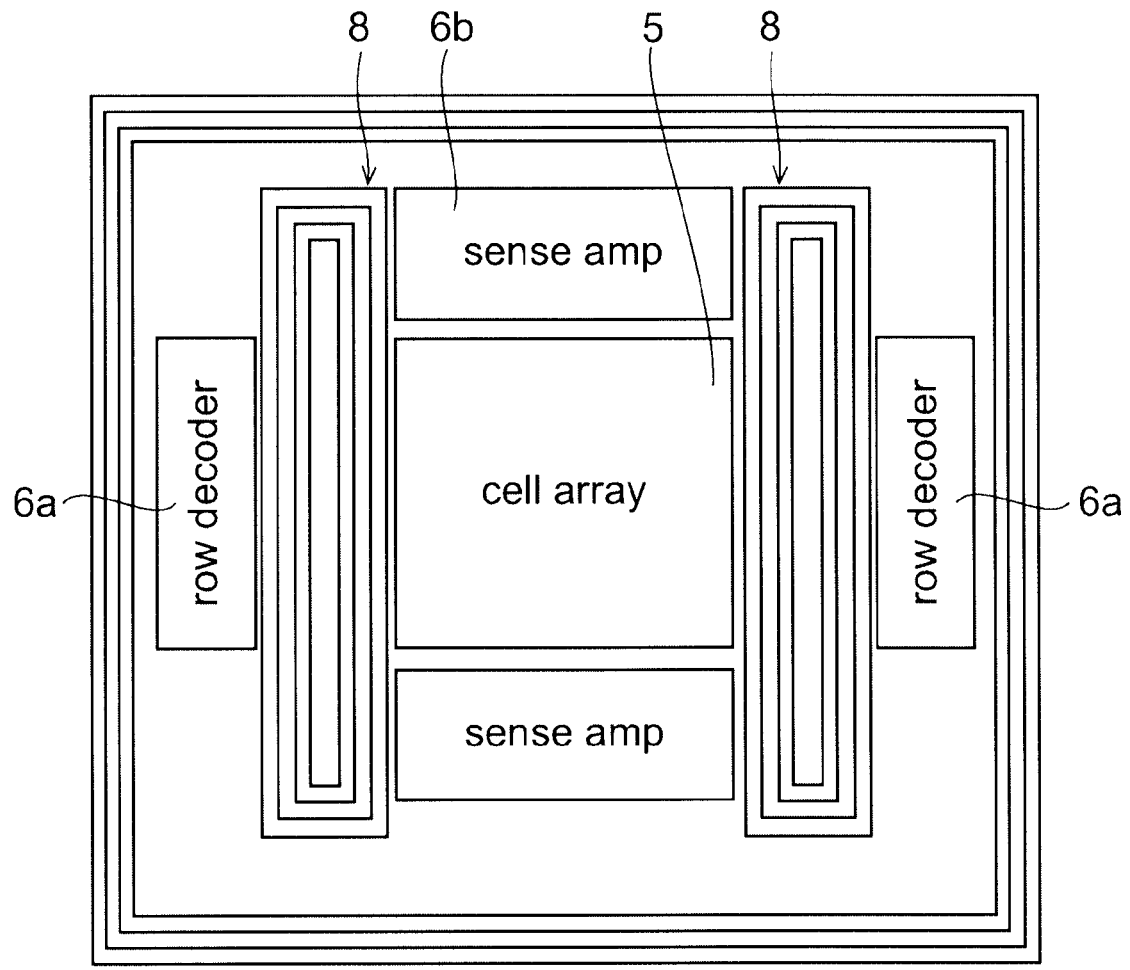
FIG. 1 is a schematic view illustrating a planar layout of the main components in a semiconductor device according to an embodiment.

FIG. 1 is a schematic view illustrating a planar layout of the main components of a semiconductor device according to an embodiment. FIG. 1 illustrates one chip region, and the one chip region is mainly divided into a memory cell array region and a peripheral circuit region.

The memory cell array region is formed at the center of the chip, and a memory cell array 5 is formed in the memory cell array region. The peripheral circuit region is formed around the memory cell array region, and row decoders 6a, sense amplifiers 6b, other circuits, and the like are formed in the peripheral circuit region.

Figure 2:
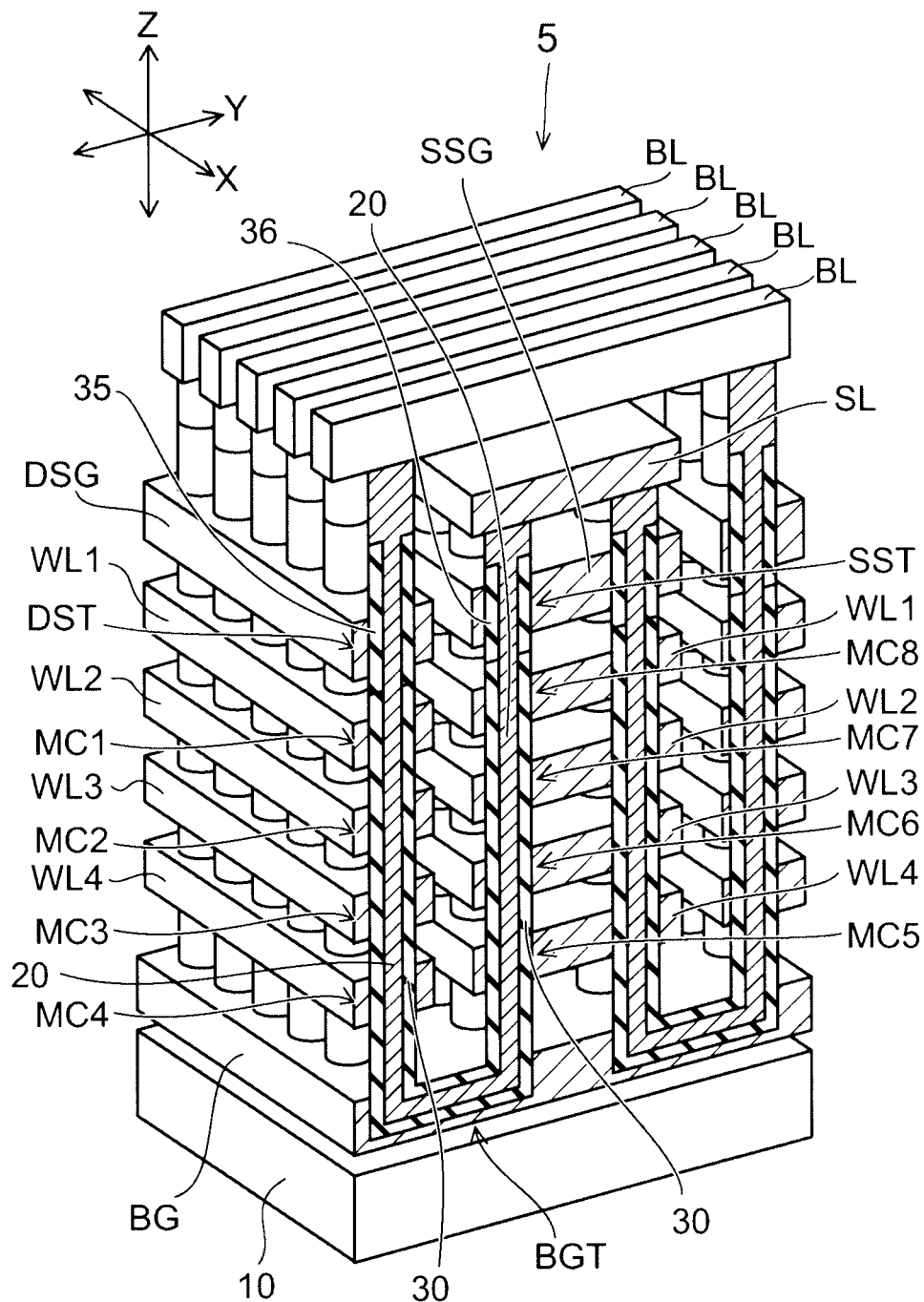
FIG. 2 is a schematic view illustrating the configuration of a memory cell array in the semiconductor device according to this embodiment.

FIG. 2 illustrates the configuration of the memory cell array 5. In FIG. 2, to facilitate visualization, illustration of insulating portions other than the insulating films formed on the inner walls of memory holes is omitted. In this embodiment, silicon is illustrated as the semiconductor, but semiconductors other than silicon may be used.

In this specification, for convenience of description, an XYZ orthogonal coordinate system is used. In this coordinate system, two directions parallel to the major surface of a substrate 10 and orthogonal to each other are defined as an X direction and a Y direction, and the direction orthogonal to both the X direction and the Y direction is defined as a Z direction. A plurality of conductive layers WL1 to WL4 are stacked in the Z direction.

A back gate BG is provided above the substrate 10 via a not-illustrated insulating layer. The back gate BG is a silicon layer doped with impurities and having conductivity, for example. The plurality of conductive layers WL1 to WL4 and not-illustrated insulating layers are alternately stacked above the back gate BG. The number of the conductive layers WL1 to WL4 is arbitrary, and the case of four layers, for example, is illustrated in this embodiment. The conductive layers WL1 to WL4 are silicon layers doped with impurities and having conductivity, for example.

The conductive layers WL1 to WL4 are divided into a plurality of blocks by grooves aligning in the X direction. A drain-side selection gate DSG is provided above the uppermost conductive layer WL1 in one block via a not-illustrated insulating layer. The drain-side selection gate DSG is a silicon layer doped with impurities and having conductivity, for example. A source-side selection gate SSG is provided above the uppermost conductive layer WL1 in another block adjacent to the block mentioned above via a not-illustrated insulating layer. The source-side selection gate SSG is a silicon layer doped with impurities and having conductivity, for example.

A source line SL is provided above the source-side selection gate SSG via a not-illustrated insulating layer. The source line SL is a silicon layer doped with impurities and having conductivity, for example. Alternatively, a metal material may be used for the source line SL. A plurality of bit lines BL are provided above the source line SL and the drain-side selection gate DSG via a not-illustrated insulating layer. Each of the bit lines BL aligns in the Y direction.

A plurality of U-shaped memory holes are formed in the stacked body described above on the substrate 10. A memory hole that pierces the drain-side selection gate DSG and the underlying conductive layers WL1 to WL4 and aligns in the Z direction is formed in a block including the drain-side selection gate DSG, and a memory hole that pierces the source-side selection gate SSG and the underlying conductive layers WL1 to WL4 and aligns in the Z direction is formed in a block including the source-side selection gate SSG. Both of the memory holes are connected via a memory hole formed in the back gate BG and aligning in the Y direction.

A silicon body 20 is provided inside the memory hole as a U-shaped semiconductor layer. A gate insulating film 35 is formed on the inner wall of the memory hole between the drain-side selection gate DSG and the silicon body 20. A gate insulating film 36 is formed on the inner wall of the memory hole between the source-side selection gate SSG and the silicon body 20. An insulating film 30 is formed on the inner wall of the memory hole between each of the conductive layers WL1 to WL4 and the silicon body 20. The insulating film 30 is formed also on the inner wall of the memory hole between the back gate BG and the silicon body 20. The insulating film 30 has an ONO (oxide-nitride-oxide) structure in which a silicon nitride film is placed between a pair of silicon oxide films, for example.

Figure 3:
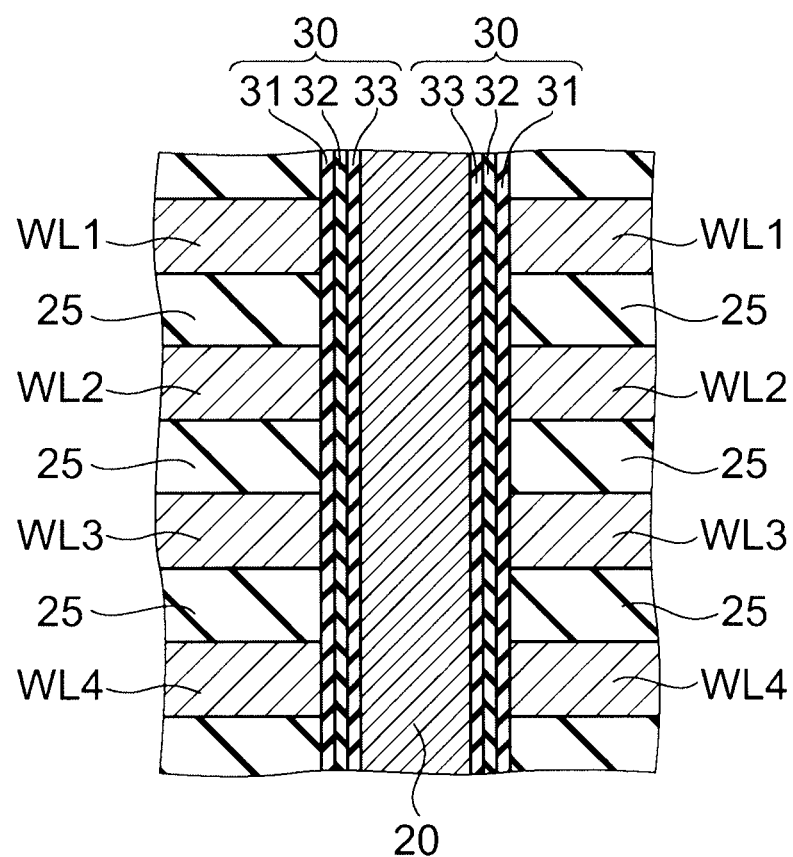
FIG. 3 is an enlarged cross-sectional view of the main section of the memory cell array.

FIG. 3 is an enlarged cross-sectional view of the portion where the silicon body 20 pierces the conductive layers WL1 to WL4 and interlayer insulating layers 25.

A first insulating film 31, a charge storage layer 32, and a second insulating film 33 are provided between the conductive layers WL1 to WL4 and the silicon body 20 in the order from the conductive layers WL1 to WL4. The first insulating film 31 is in contact with the conductive layers WL1 to WL4, the second insulating film 33 is in contact with the silicon body 20, and the charge storage layer 32 is provided between the first insulating film 31 and the second insulating film 33.

The silicon body 20 functions as a channel, the conductive layers WL1 to WL4 function as control gates, and the charge storage layer 32 functions as a data memory layer that stores a charge injected from the silicon body 20. That is, a memory cell having a configuration in which the control gate surrounds the channel is formed at the intersection of the silicon body 20 and each of the conductive layers WL1 to WL4.

The semiconductor device according to this embodiment is a nonvolatile semiconductor memory device that can electrically erase and write data freely and can retain memory contents even when the power is turned off. For example, the memory cell is a memory cell of charge trap structure. The charge storage layer 32 includes a large number of traps that confine a charge (electron), and is made of, for example, a silicon nitride film. The second insulating film 33 is made of, for example, a silicon oxide film and becomes an electric potential barrier when a charge is injected from the silicon body 20 into the charge storage layer 32 or when a charge stored in the charge storage layer 32 diffuses into the silicon body 20. The first insulating film 31 is made of, for example, a silicon oxide film and prevents a charge stored in the charge storage layer 32 from diffusing into the conductive layers WL1 to WL4.

Referring to FIG. 2 again, the gate insulating film 35 is provided between the silicon body 20 that pierces the drain-side selection gate DSG and the drain-side selection gate DSG, and these form a drain-side selection transistor DST. The upper end portion of the silicon body 20 protruding upward from the drain-side selection gate DSG is connected to the corresponding bit line BL.

The gate insulating film 36 is provided between the silicon body 20 that pierces the source-side selection gate SSG and the source-side selection gate SSG, and these form a source-side selection transistor SST. The upper end portion of the silicon body 20 protruding upward from the source-side selection gate SSG is connected to the source line SL.

The back gate BG, the silicon body 20 provided in the back gate BG, and the insulating film 30 between the back gate BG and the silicon body 20 form a back gate transistor BGT.

A memory cell MC1 using the conductive layer WL1 as a control gate, a memory cell MC2 using the conductive layer WL2 as a control gate, a memory cell MC3 using the conductive layer WL3 as a control gate, and a memory cell MC4 using the conductive layer WL4 as a control gate are provided between the drain-side selection transistor DST and the back gate transistor BGT.

A memory cell MC5 using the conductive layer WL4 as a control gate, a memory cell MC6 using the conductive layer WL3 as a control gate, a memory cell MC7 using the conductive layer WL2 as a control gate, and a memory cell MC8 using the conductive layer WL1 as a control gate are provided between the back gate transistor BGT and the source-side selection transistor SST.

The drain-side selection transistor DST, the memory cells MC1 to MC4, the back gate transistor BGT, the memory cells MC5 to MC8, and the source-side selection transistor SST are connected in series and form one memory string. A plurality of such memory strings are arranged in the X and Y directions, and thereby the plurality of memory cells MC1 to MC8 are provided three-dimensionally in the X, Y, and Z directions.

Figure 4:
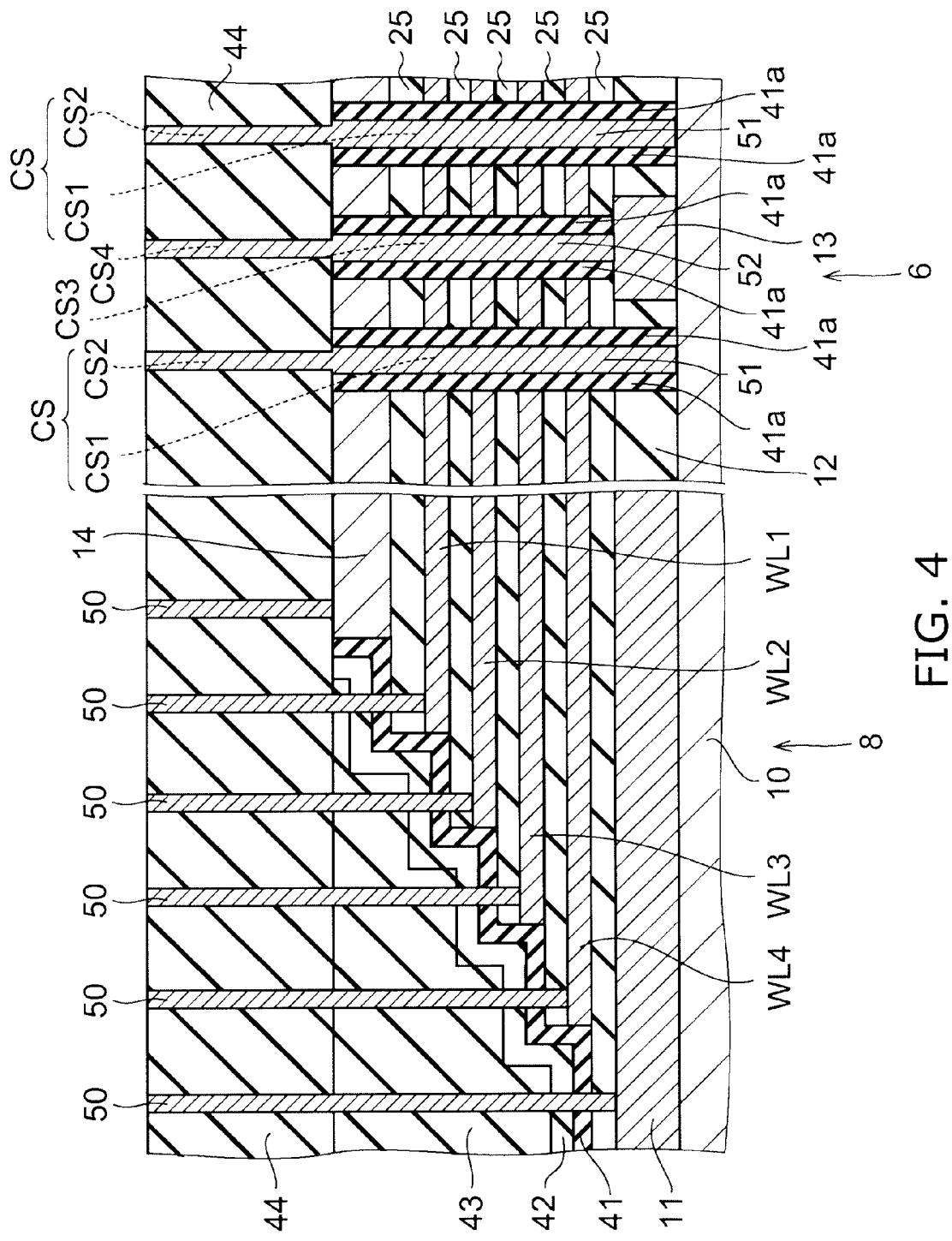
FIG. 4 is a schematic cross-sectional view of a contact region and a peripheral circuit region of a memory cell control gate in a semiconductor device according to a first embodiment.

FIG. 4 illustrates a cross-sectional structure of a staircase-shape contact region 8 for connecting each of the conductive layers WL1 to WL4 to a not-illustrated upper-layer interconnect and part of a peripheral circuit region 6. The staircase-shape contact region 8 is formed between the memory cell array 5 and the row decoder 6a illustrated in FIG. 1, for example.

In FIG. 4, the interlayer insulating layers omitted in FIG. 2 are illustrated as insulating layers 25. A stacked body in which the insulating layers 25 and the conductive layers WL1 to WL4 are alternately stacked is provided over the memory cell array region, the staircase-shape contact region 8, and the peripheral circuit region 6.

A conductive layer 14 in FIG. 4 corresponds to the drain-side selection gate DSG or the source-side selection gate SSG in FIG. 2. A conductive layer 11 in FIG. 4 corresponds to the back gate BG in FIG. 2.

Part of the stacked body described above is processed into a staircase shape in the staircase-shape contact region 8. In other words, the lower the conductive layer is, the longer it is formed. This staircase structure unit is covered with a spacer layer 41 and a stopper layer 42 provided thereon, and interlayer insulating layers 43 and 44 are provided on the stopper layer 42. The spacer layer 41 and the interlayer insulating layers 43 and 44 are silicon oxide, and the stopper layer 42 is silicon nitride, for example.

A plurality of contact holes are formed in the interlayer insulating layers 44 and 43, the stopper layer 42, and the spacer layer 41 to pierce there, and a contact electrode 50 is formed in each of the contact holes.

Each of the contact holes also pierces the insulating layer below the spacer layer 41 to reach each of the staircase-shape conductive layers 14, WL1 to WL4, and 11. Each of the conductive layers 14, WL1 to WL4, and 11 is connected to the not-illustrated upper-layer interconnect via the contact electrode 50.

A transistor is formed on the surface of the substrate 10 in the peripheral circuit region 6. Part of the conductive layer 11 is selectively provided on the substrate 10 in the peripheral circuit region 6 as a gate electrode 13. An insulating layer 12 is provided in portions other than the gate electrode 13. A stacked body of the insulating layers 25 and the conductive layers WL1 to WL4 is provided on the insulating layer 12, and the interlayer insulating layer 44 is provided on the stacked body.

Providing the stacked body mentioned above also in the peripheral circuit region 6 prevents generation of a large step in the chip. The conductive layers WL1 to WL4 in the peripheral circuit region 6 do not function as the control gates of memory cells.

The transistor of the peripheral circuit region 6 includes a source region and a drain region formed on the surface of the substrate 10, and these regions are electrically connected to the upper-layer interconnect via contact electrodes 51. The contact electrode 51 is provided in a contact hole CS that pierces the interlayer insulating layer 44, the conductive layers 14 and WL1 to WL4, and the insulating layers 25 and 12 to reach the surface of the substrate 10.

The contact hole CS includes: a first contact hole CS1 formed to pierce the conductive layers 14 and WL1 to WL4, and the insulating layers 25 and 12; and a second contact hole CS2 formed to pierce the interlayer insulating layer 44. An insulating film (for example, a silicon oxide film) 41a is provided on the side wall of the first contact hole CS1 to insulate the conductive layers 14 and WL1 to WL4 from the contact electrode 51.

The second contact hole CS2 is located on the first contact hole CS1. The hole diameter of the bottom of the second contact hole CS2 is smaller than the hole diameter of the top of the first contact hole CS1.

The gate electrode 13 is electrically connected to the upper-layer interconnect via a contact electrode 52 provided in contact holes CS4 and CS3 that pierce the interlayer insulating layer 44, the conductive layers 14 and WL1 to WL4, and the insulating layers 25 to reach the gate electrode 13.

The contact hole CS4 pierces the interlayer insulating layer 44 and is formed simultaneously with the contact hole CS2.

The contact hole CS3 pierce the conductive layers 14 and WL1 to WL4 and the insulating layers 25 and is formed simultaneously with the contact hole CS1. The insulating film (for example, a silicon oxide film) 41a is provided on the side wall of the contact hole CS3 to insulate the conductive layers 14 and WL1 to WL4 from the contact electrode 52.

The contact hole CS4 is located on the contact hole CS3, and the hole diameter of the bottom of the contact hole CS4 is smaller than the hole diameter of the top of the contact hole CS3.

Next, a method for forming the contact hole CS in the semiconductor device according to the first embodiment will now be described with reference to FIG. 5A to FIG. 9B.

Figure 5A:
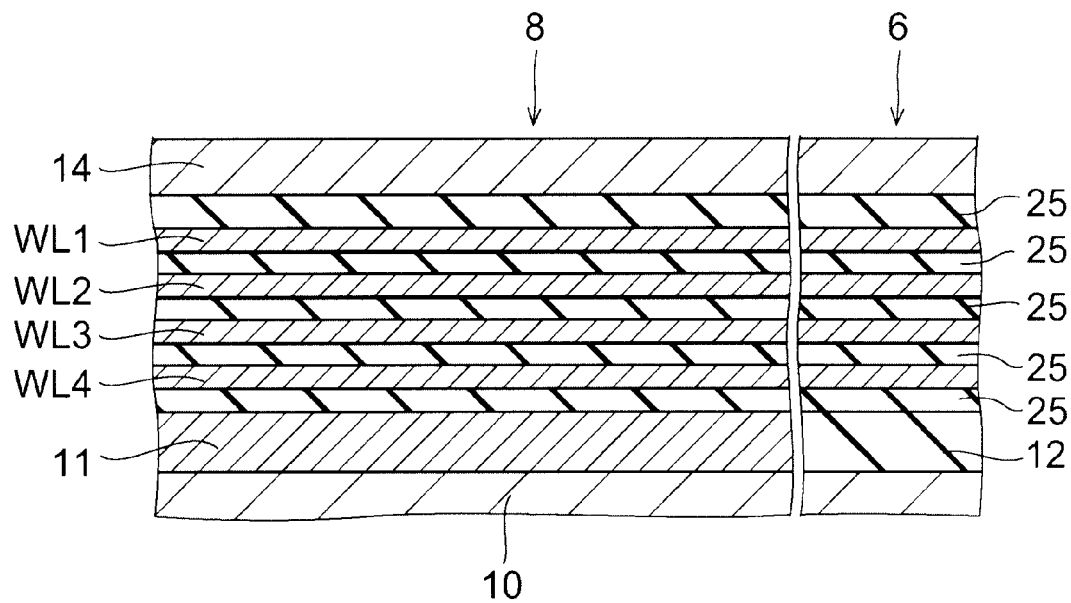
FIGS. 5A to 9B are schematic cross-sectional views illustrating a method for manufacturing the semiconductor device according to the first embodiment.

First, as illustrated in FIG. 5A, the conductive layer 11 is formed on the substrate 10. The conductive layer 11 in the peripheral circuit region 6 is patterned, and the insulating layer 12 is provided in portions other than the gate electrodes 13 illustrated in FIG. 4. The insulating layers 25 and the conductive layers WL1 to WL4 are alternately stacked on the conductive layer 11 and the insulating layer 12. The conductive layer 14 is formed on the uppermost insulating layer 25.

Figure 5B:
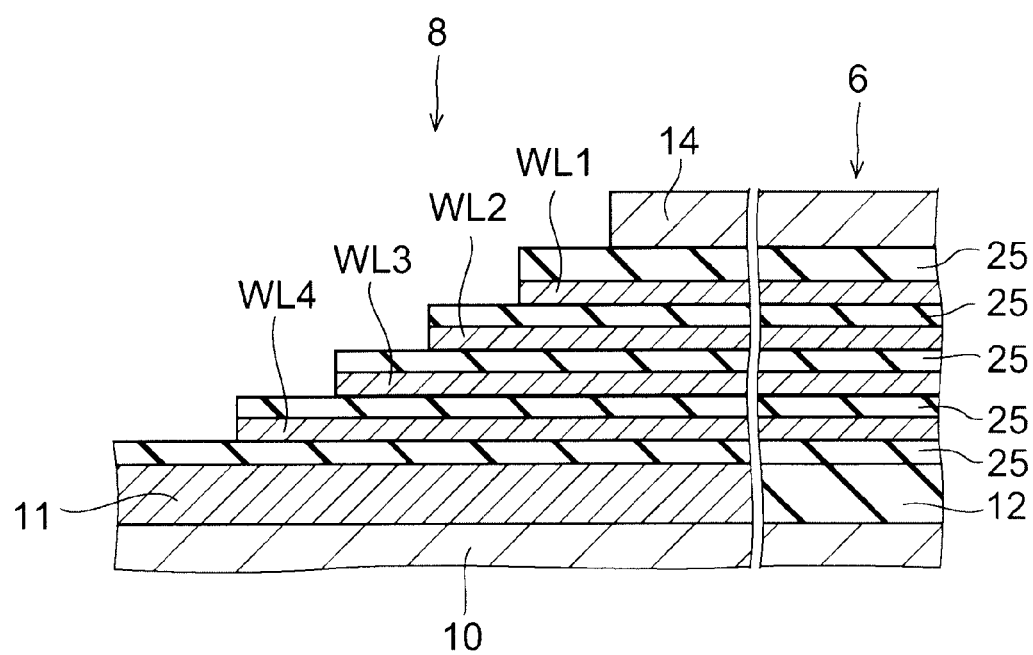

In this stacked body, the memory cell array 5 illustrated in FIG. 2 is formed for the memory cell array region. Further, processing into the staircase structure is performed for the staircase-shape contact region 8 as illustrated in FIG. 5B. Specifically, a slimming process that decreases the planar size of a not-illustrated resist film and a process that etches one insulating layer 25 and conductive layer by using the resist film as a mask are repeated multiple times.

Figure 6A:
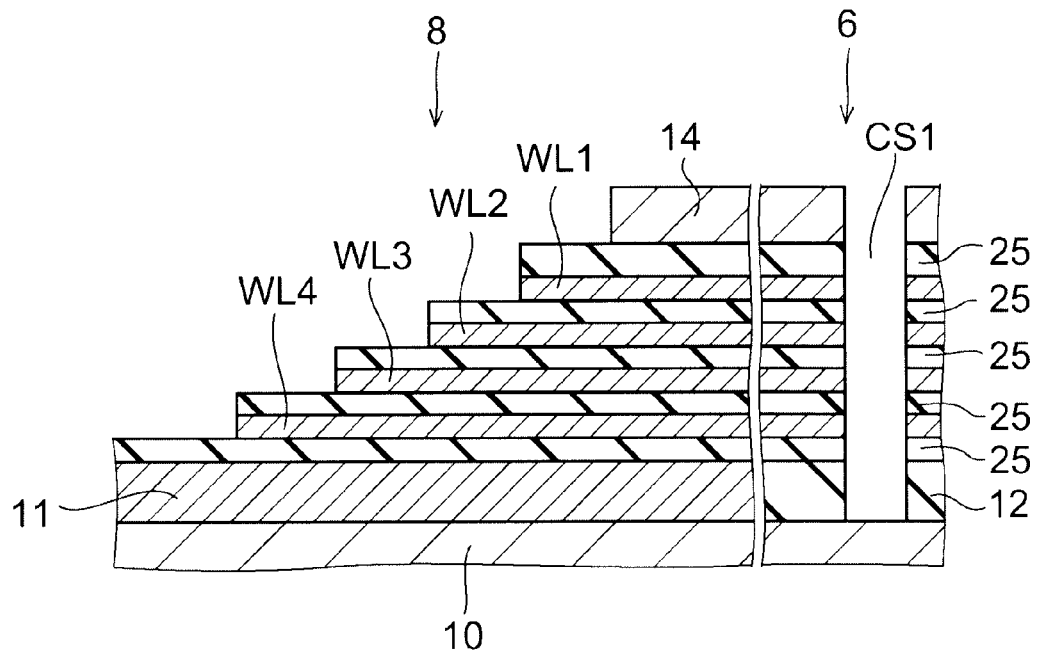

After forming the staircase structure, the first contact hole CS1 is formed in the stacked body (a first processing layer) in the peripheral circuit region 6 as illustrated in FIG. 6A. The first contact hole CS1 pierces the conductive layers 14, WL1 to WL4, and 11, and the insulating layers 25 and 12 to reach the source or drain region of the peripheral circuit transistor formed on the surface of the substrate 10.

The first contact hole CS1 is formed by, for example, the RIE (reactive ion etching) method. This first contact hole CS1 has a relatively large hole diameter, and its aspect ratio (ratio of depth to hole diameter) is not so high. Therefore, the difficulty level of the processing is low.

Figure 6B:
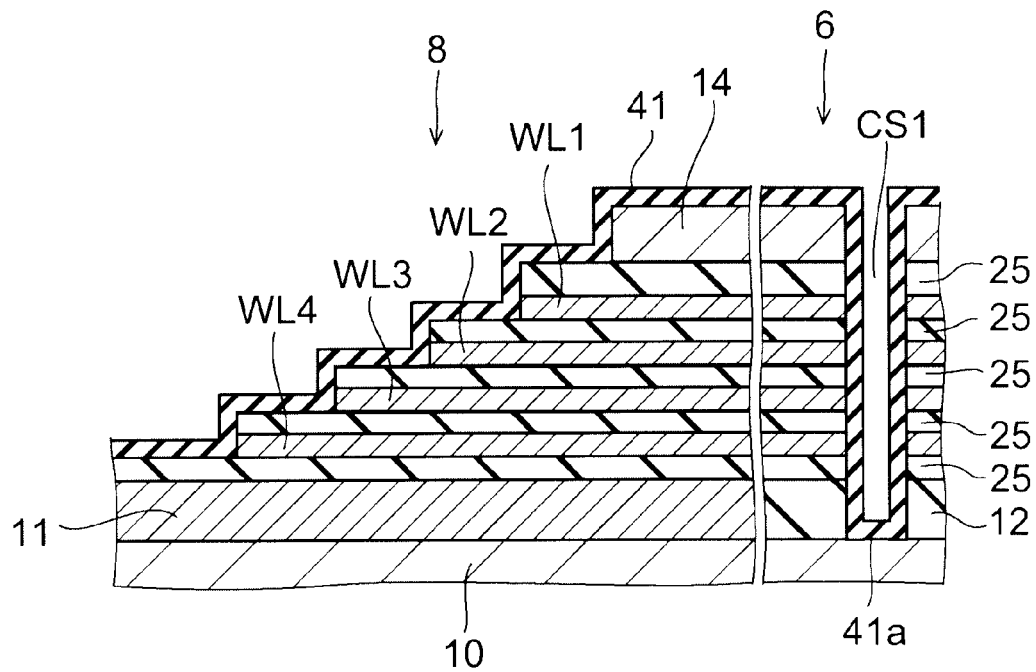

Next, as illustrated in FIG. 6B, the spacer layer 41 that covers the surface of the staircase structure unit is formed. At this time, the spacer layer 41 is formed also on the upper surface of the conductive layer 14 in the peripheral circuit region 6 and on the inner wall (side wall and bottom) of the first contact hole CS1. The spacer layer 41 is, for example, silicon oxide; therefore, the insulating film 41a is formed on the side wall and the bottom of the first contact hole CS1. Forming the insulating film 41a on the side wall of the first contact hole CS1 decreases the hole diameter of the first contact hole CS1 from the state of FIG. 6A and adjusts it to an appropriate value.

Figure 7A:
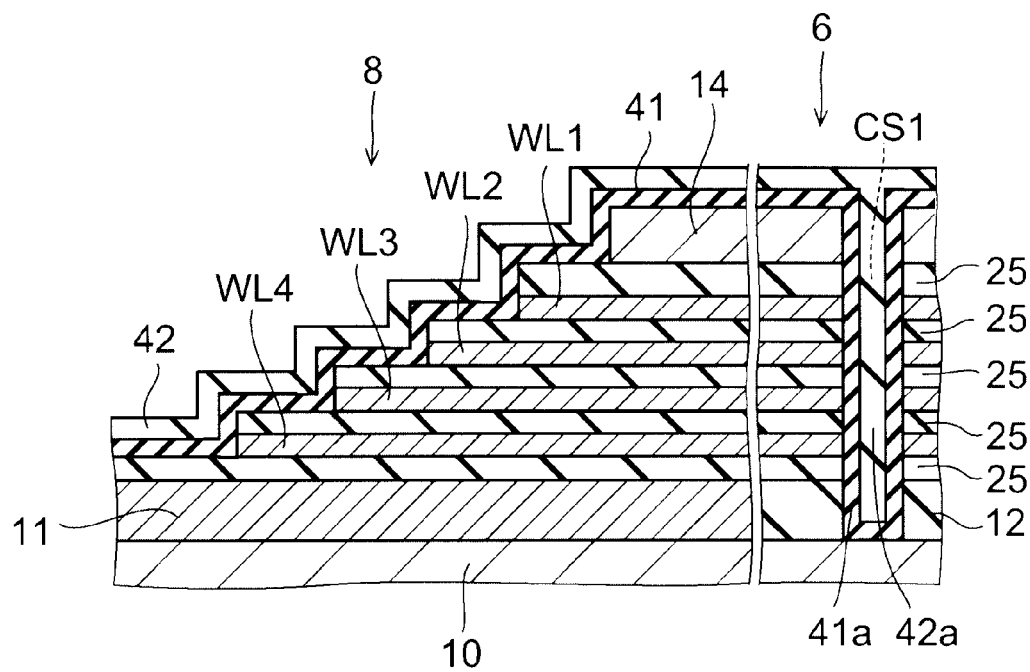

Next, as illustrated in FIG. 7A, the stopper layer 42 that covers the spacer layer 41 of the staircase structure unit is formed. At this time, the stopper layer 42 is formed also in the peripheral circuit region 6, and silicon nitride, for example, that forms the stopper layer 42 is buried as a sacrificial film 42a in the first contact hole CS1 on the inside of the insulating film 41a.

Figure 7B:
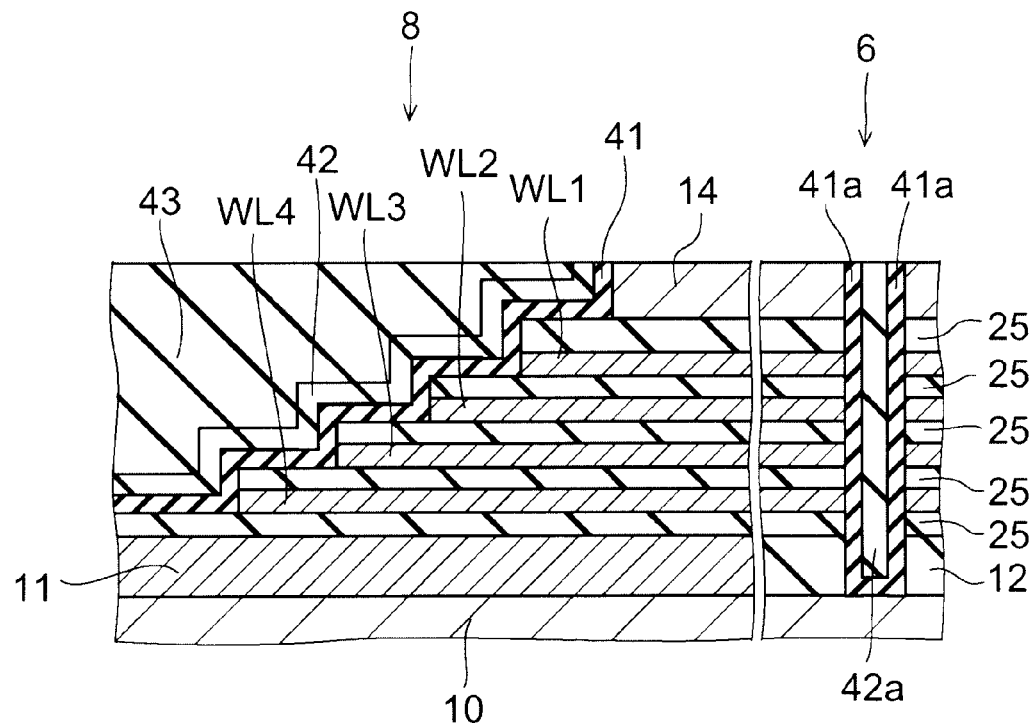

Next, the interlayer insulating layer 43 is formed on the staircase structure unit and on the stopper layer 42 in the peripheral circuit region 6, and then etchback is performed as illustrated in FIG. 7B. Thereby, the spacer layer 41 in the staircase structure unit and the insulating film 41a in the peripheral circuit region 6 are separated, and the stopper layer 42 in the staircase structure unit and the sacrificial film 42*a* in the peripheral circuit region 6 are separated.

Figure 8A:
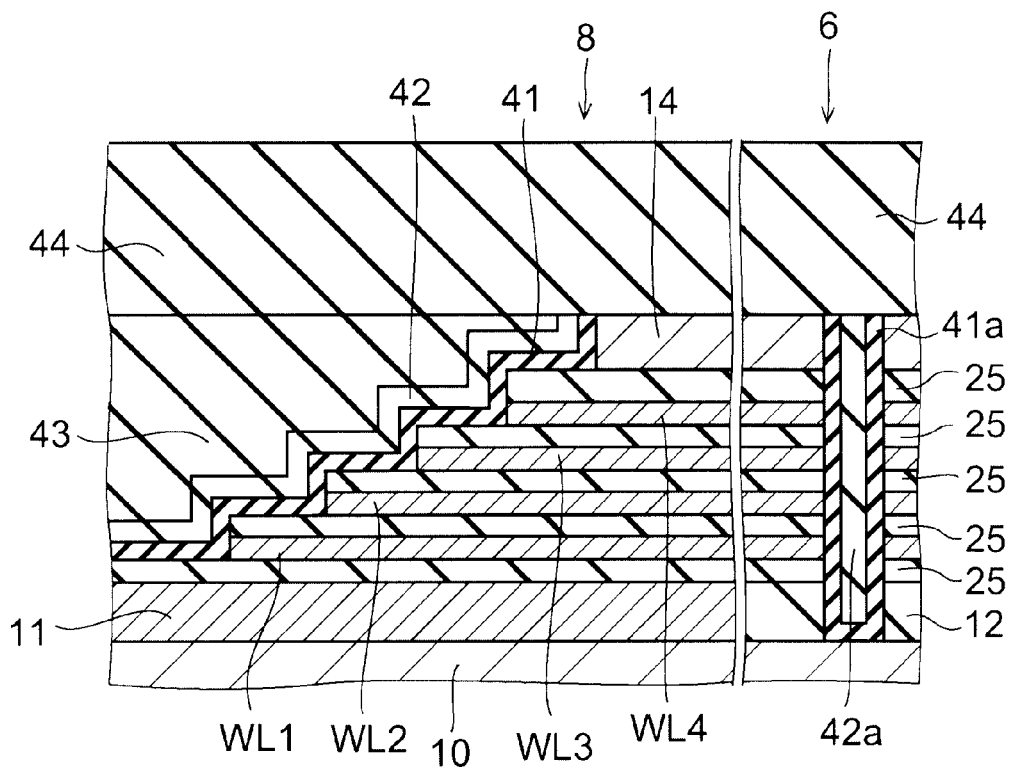

Next, as illustrated in FIG. 8A, the interlayer insulating layer 44 is formed on the stacked body in the staircase structure unit and the peripheral circuit region 6 as a second processing layer.

Figure 8B:
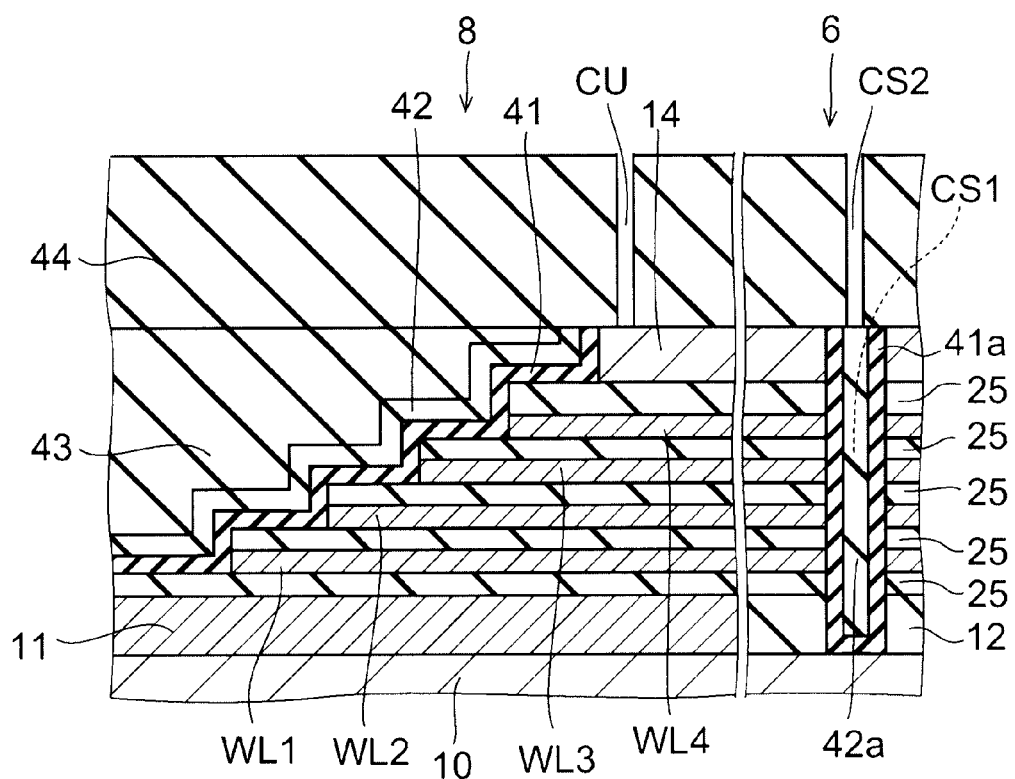

Next, as illustrated in FIG. 8B, a contact hole CU is formed in the interlayer insulating layer 44 on the conductive layer 14 in the staircase structure unit, and the second contact hole CS2 is formed in the interlayer insulating layer 44 on the sacrificial film 42*a*. The contact hole CU and the second contact hole CS2 are formed simultaneously by the RIE method using a not-illustrated etching mask. The contact hole CU pierces the interlayer insulating layer 44 to reach the conductive layer 14.

The second contact hole CS2 pierces the interlayer insulating layer 44 to reach the sacrificial film 42*a*. At this time, the hole diameter of the bottom of the second contact hole CS2 is made smaller than the hole diameter of the top of the first contact hole CS1 in order to prevent the second contact hole CS2 from shifting from the top of the first contact hole CS1 to be formed on the conductive layer 14 due to positional misalignment. Thereby, a short circuit between the contact electrode provided in the second contact hole CS2 and the conductive layer 14 can be certainly avoided.

Next, the sacrificial film 42*a* in the first contact hole CS1 is removed via the second contact hole CS2. For example, the sacrificial film 42*a* that is silicon nitride is removed from the first contact hole CS1 by wet etching using hot phosphoric acid. By removing the sacrificial film 42*a*, the first contact hole CS1 and the second contact hole CS2 are connected to each other and become a continuous hole as illustrated in FIG. 9A.

Figure 9A:
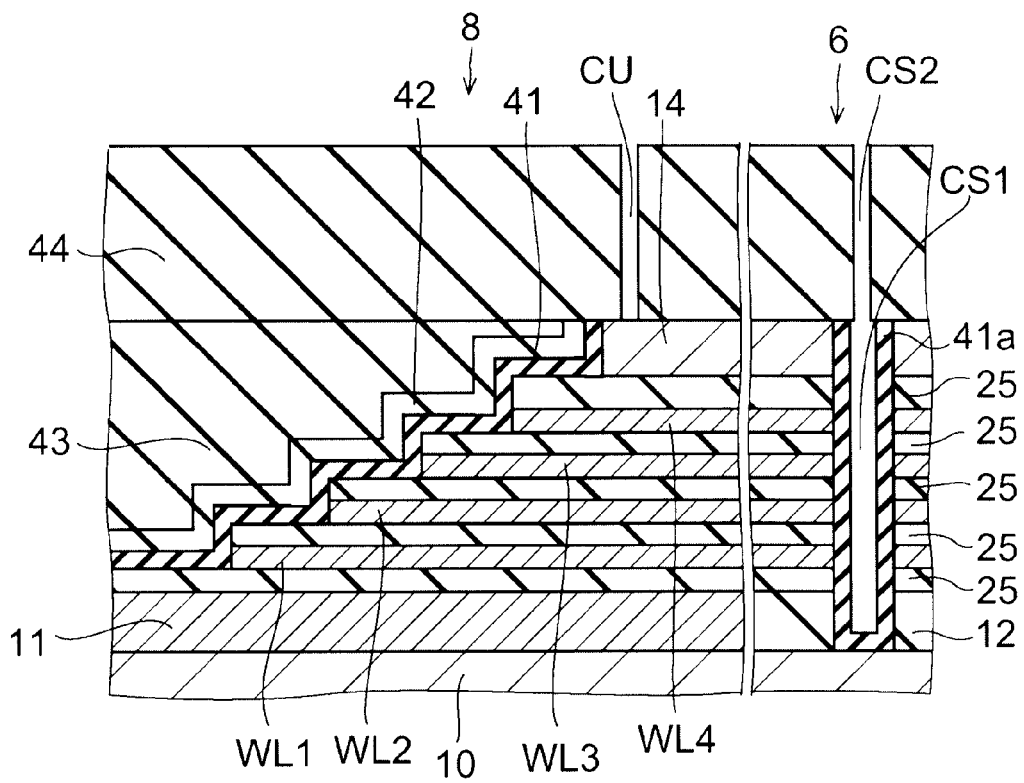
Figure 9B:
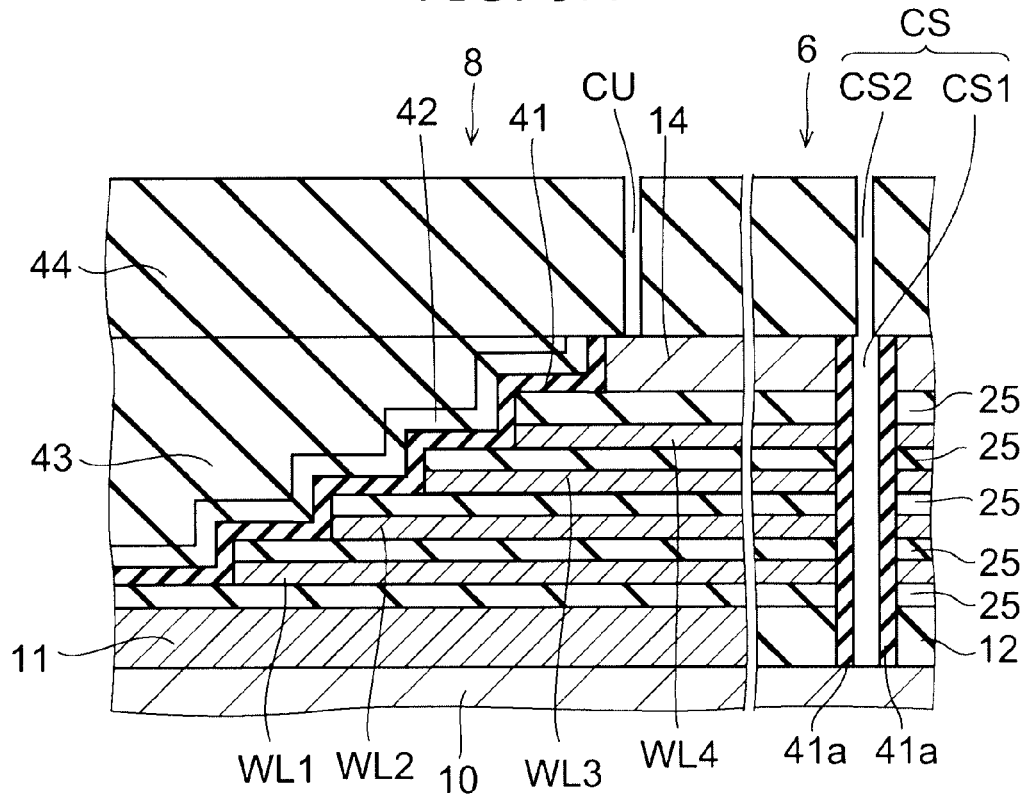

Then, by etching-back the entire surface of the stacked body illustrated in FIG. 9A, the insulating film 41*a* at the bottom of the first contact hole CS1 is removed. Thereby, as illustrated in FIG. 9B, the source or drain region of the peripheral circuit transistor formed on the surface of the substrate 10 is exposed at the bottom of the first contact hole CS1.

A plurality of peripheral circuit transistors are formed in the peripheral circuit region 6, and accordingly a plurality of contact holes CS are formed simultaneously. The contact hole CS3 that reaches the gate electrode 13 of the peripheral circuit transistor in the peripheral circuit region 6 illustrated in FIG. 4 is formed simultaneously with the first contact hole CS1 mentioned above, and the contact hole CS4 on the contact hole CS3 is formed simultaneously with the second contact hole CS2 mentioned above.

After that, each contact hole that reaches each of the conductive layers WL1 to WL4 and 11 in the staircase structure unit is formed. Then, the contact electrode 50 is buried in the contact hole in the staircase structure unit and the contact hole CU; the contact electrode 51 is buried in the contact hole CS in the peripheral circuit region 6; and the contact electrode 52 is buried in the contact holes CS3 and CS4. The contact electrodes 50 to 52 are made of the same material and are buried simultaneously in the respective contact holes.

When forming the contact holes in the staircase structure unit, the stopper layer 42, which is silicon nitride, functions as an etching stopper during the etching of the interlayer insulating layers 44 and 43, which are silicon oxide. The spacer layer 41, which is silicon oxide, below the stopper layer 42 functions as an etching stopper during the etching of the stopper layer 42. Accordingly, the difference in the degree of etching progress can be reduced when the plurality of contact holes having different depths are collectively formed in the staircase structure unit, and the contact holes can be prevented from piercing the conductive layers, which are connection destinations, particularly on the side of shallow contact holes.

Various contact holes are formed in the semiconductor device according to this embodiment. Out of them, the contact hole CS that reaches the surface of the substrate 10 in the peripheral circuit region 6 becomes the deepest contact hole. In the semiconductor device according to this embodiment, increasing capacity can be achieved by increasing the number of the stacked conductive layers WL1 to WL4 that function as the control gates of memory cells. Increasing capacity causes an increase of the thickness of the stacked body, which the contact hole CS pierces to reach the substrate 10. In other words, it causes an increase in an aspect ratio of the contact hole CS.

The difficulty level of processing a contact hole with a high aspect ratio by the RIE method is high. For example, in the case of a contact hole with an aspect ratio (ratio of depth to hole diameter) of approximately 20, the hole diameter of the bottom changes by 11 nm when the cone angle of the side wall of the hole changes by 0.1 degree. Therefore, the shape controllability is difficult. A variation in the hole diameter of the bottom of the contact hole CS may lead to a variation in the contact resistance between the peripheral circuit transistor and the contact electrode 51, and eventually it may lead to a variation in the characteristics of the peripheral circuit transistor.

In this embodiment described above, the first contact hole CS1, which is formed in the stacked body including the plurality of conductive layers WL1 to WL4 and has a relatively high aspect ratio, is formed not by the RIE method but by removing the sacrificial film 42*a*. The hole diameter of the first contact hole CS1, which is formed at the stage of FIG. 6A before the sacrificial film 42*a* is buried, is not so small, and accordingly the aspect ratio is not so high. Therefore, the difficulty level of the processing is low.

The second contact hole CS2 formed by the RIE method in the interlayer insulating layer (second processing layer) 44, which is a layer thinner than the stacked body (first processing layer) including the plurality of conductive layers WL1 to WL4, is not so deep, and accordingly the aspect ratio is not so high. Therefore, in this embodiment, it is not necessary to process a contact hole with a high aspect ratio by the RIE method when forming the contact hole CS that reaches the surface of the substrate 10, and it is possible to decrease the difficulty level of the processing.

A decrease in the difficulty level of the processing increases the shape controllability of the contact hole CS. The area of the portion where the contact electrode 51 is in contact with the surface of the substrate 10 is determined by the hole diameter of the first contact hole CS1 on the inside of the insulating film 41*a* of which the dimension is adjusted by the process of FIG. 6B. This can be easily controlled by the film thickness control at the time of the formation of the insulating film 41*a*. Consequently, this embodiment is excellent in the controllability of obtaining a desired dimension for the hole diameter of the bottom of the contact hole CS, which reaches the surface of the substrate 10 and has a high aspect ratio, and can suppress a characteristic variation of the peripheral circuit transistor.

Figure 10:
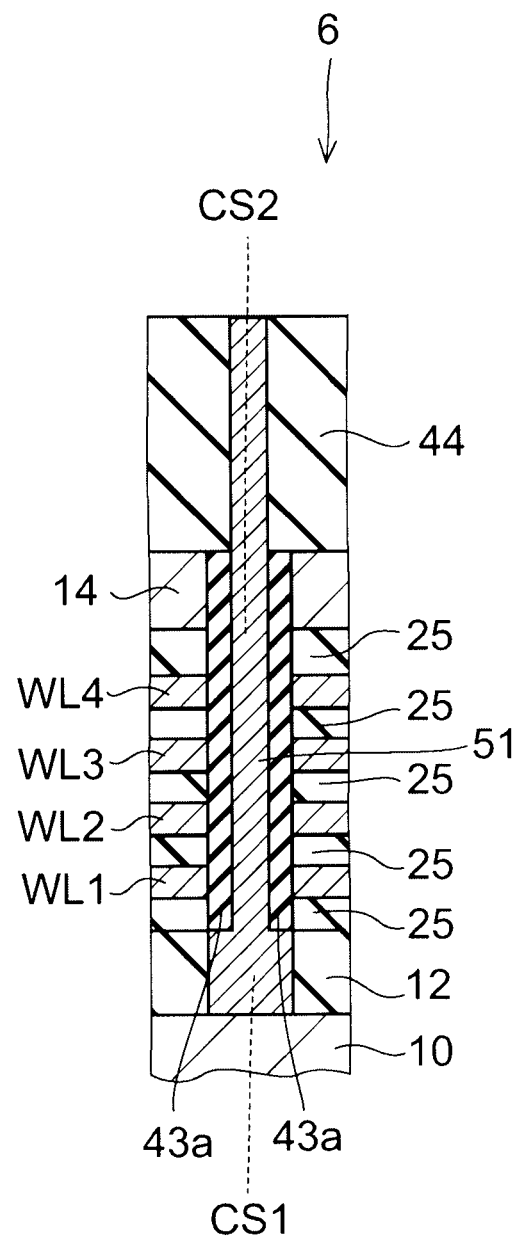
FIG. 10 is a schematic cross-sectional view of a peripheral circuit region in a semiconductor device according to a second embodiment.

Next, FIG. 10 is a schematic cross-sectional view of part of the peripheral circuit region 6 in a semiconductor device according to a second embodiment.

In this embodiment as well, the source or drain region of the peripheral circuit transistor formed on the surface of the substrate 10 in the peripheral circuit region 6 is electrically connected to the upper-layer interconnect via the contact electrode 51. The contact electrode 51 is provided in the contact holes CS2 and CS1 that pierce the interlayer insulating layer 44, the conductive layers 14 and WL1 to WL4, and the insulating layers 25 and 12 to reach the surface of the substrate 10.

The first contact hole CS1 is formed to pierce the insulating layer 12, which is the first processing layer in this embodiment, and reaches the surface of the substrate 10. The second contact hole CS2 is formed to pierce the interlayer insulating layer 44, the conductive layers 14 and WL1 to WL4, and the insulating layers 25, which form the second processing layer in this embodiment. An insulating film 43a is interposed between the contact electrode 51, and the conductive layers 14 and WL1 to WL4 to insulate both of them from each other.

The second contact hole CS2 is located on the first contact hole CS1, and the hole diameter of the bottom of the second contact hole CS2 is smaller than the hole diameter of the top of the first contact hole CS1. In this embodiment, the first processing layer (the insulating layer 12) is thinner than the second processing layer (the interlayer insulating layer 44, the conductive layers 14 and WL1 to WL4, and the insulating layers 25). Therefore, the first contact hole CS1 formed in the first processing layer is shallower and has a lower aspect ratio than the second contact hole CS2 formed in the second processing layer. The aspect ratio here represents the ratio of the depth to the hole diameter of the upper end of the contact hole.

Next, a method for forming the contact holes CS1 and CS2 illustrated in FIG. 10 will now be described with reference to FIG. 11A to FIG. 15B.

Figure 11A:
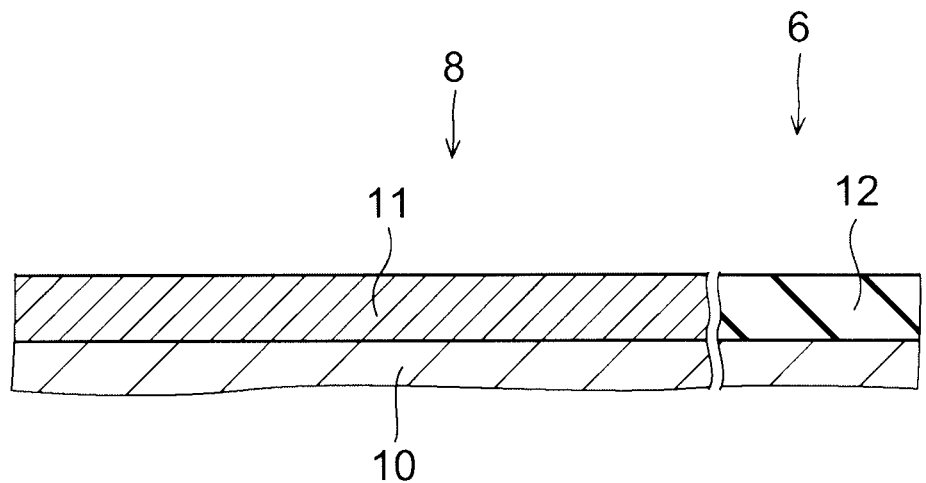
FIGS. 11A to 15B are schematic cross-sectional views illustrating a method for manufacturing the semiconductor device according to the second embodiment.

First, as illustrated in FIG. 11A, the conductive layer 11 is formed on the substrate 10. The conductive layer 11 in the peripheral circuit region 6 is patterned, and the insulating layer 12 is provided in portions other than the gate electrode 13 illustrated in FIG. 4.

Figure 11B:
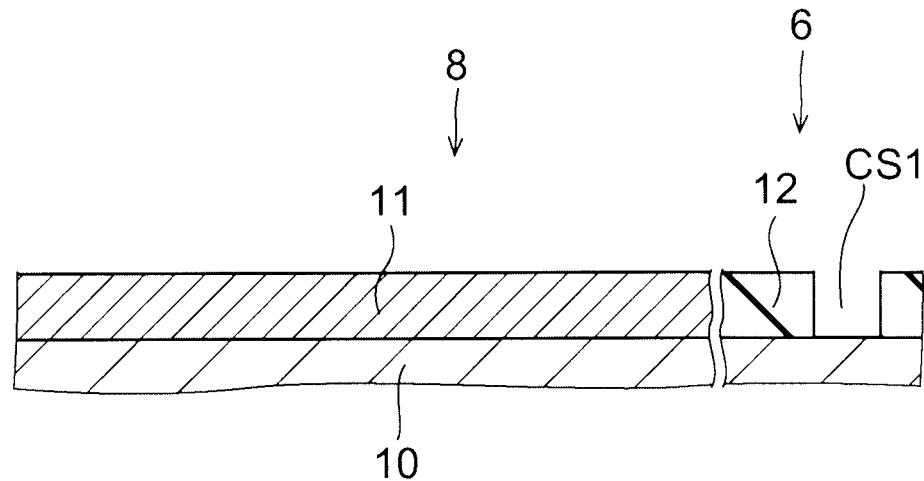

Next, as illustrated in FIG. 11B, the first contact hole CS1 is formed in the insulating layer 12 in the peripheral circuit region 6. The first contact hole CS1 pierces the insulating layer 12 to reach the source or drain region of the peripheral circuit transistor formed on the surface of the substrate 10.

The first contact hole CS1 is formed by the RIE method, for example. The first contact hole CS1 is formed in the relatively thin insulating layer 12 before the stacked body including the plurality of conductive layers WL1 to WL4 is stacked. Therefore, the first contact hole CS1 is shallow and does not have a high aspect ratio, and the difficulty level of the processing is low.

Figure 12A:
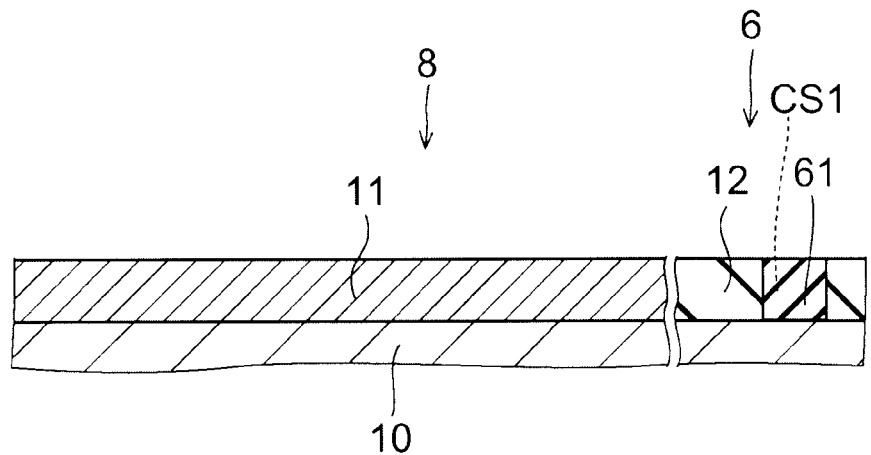

Next, as illustrated in FIG. 12A, a sacrificial film 61 is buried in the first contact hole CS1. The sacrificial film 61 is silicon nitride, for example.

Figure 12B:
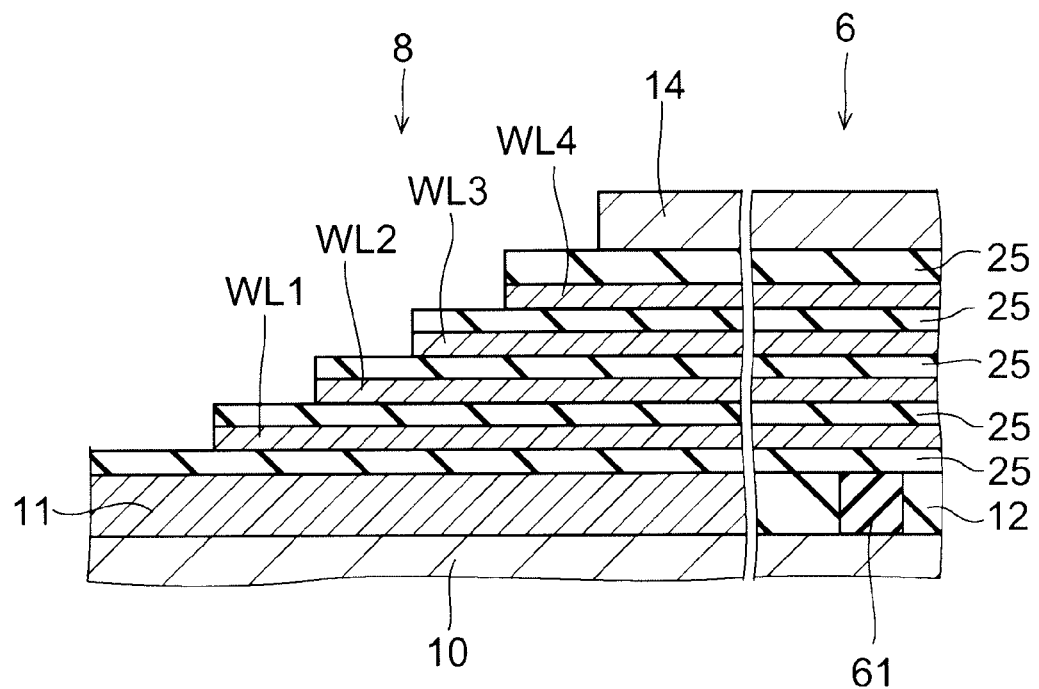

Next, the insulating layers 25 and the conductive layers WL1 to WL4 are alternately stacked on the conductive layer 11 and the insulating layer 12, and the conductive layer 14 is formed on the uppermost insulating layer 25. In this stacked body, the memory cell array 5 illustrated in FIG. 2 is formed for the memory cell array region. The processing of the staircase structure is performed for the staircase-shape contact region 8 as illustrated in FIG. 12B.

Figure 13A:
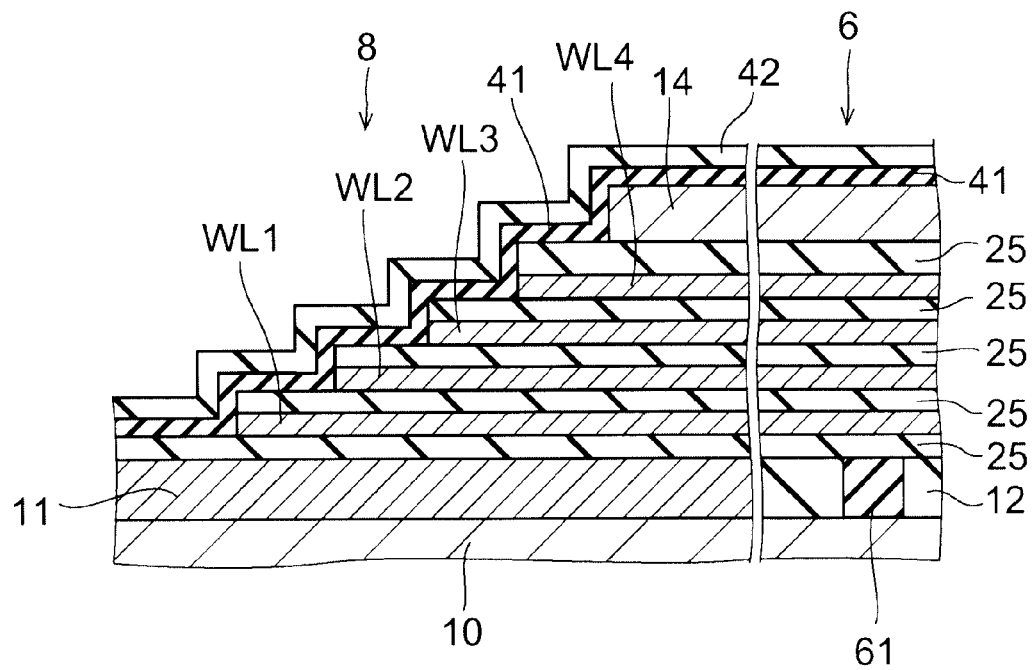
Figure 13B:
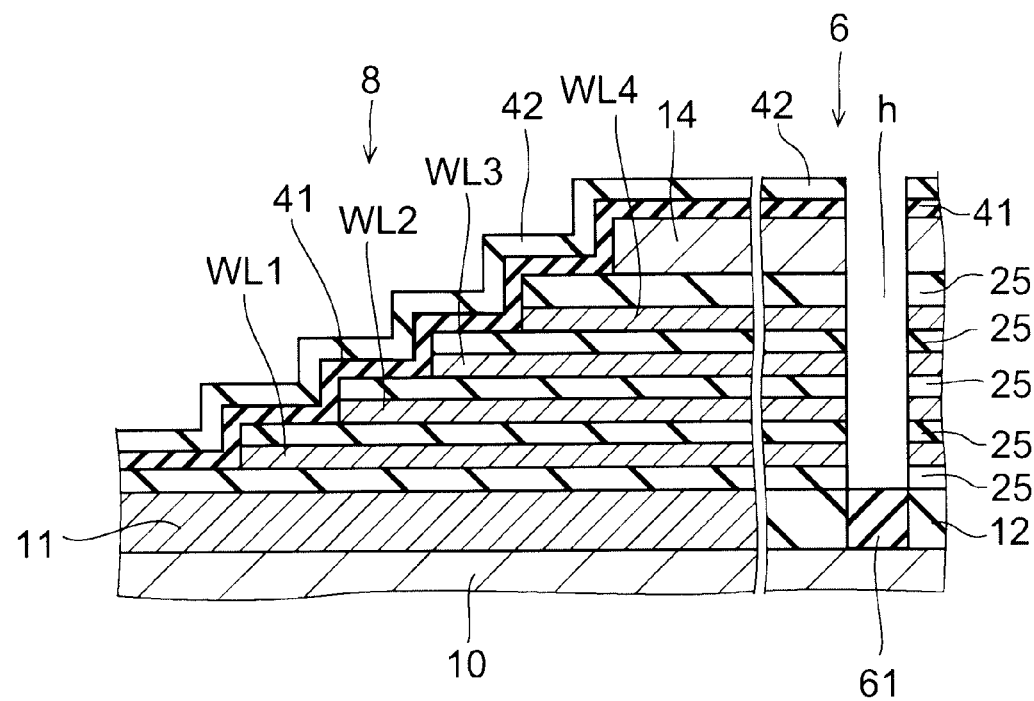

Next, as illustrated in FIG. 13A, the spacer layer 41 that covers the conductive layer 14 in the staircase structure unit and the peripheral circuit region 6 is formed, and the stopper layer 42 that covers the spacer layer 41 is formed.

Next, a dummy hole h is formed in the stacked body on the sacrificial film 61 in the peripheral circuit region 6 by, for example, the RIE method. The dummy hole h pierces the stopper layer 42, the spacer layer 41, the conductive layers 14 and WL1 to WL4, and the insulating layers 25 in the peripheral circuit region 6 to reach the sacrificial film 61. The dummy hole h has a hole diameter substantially equal to the hole diameter of the first contact hole CS1, for example.

Figure 14A:
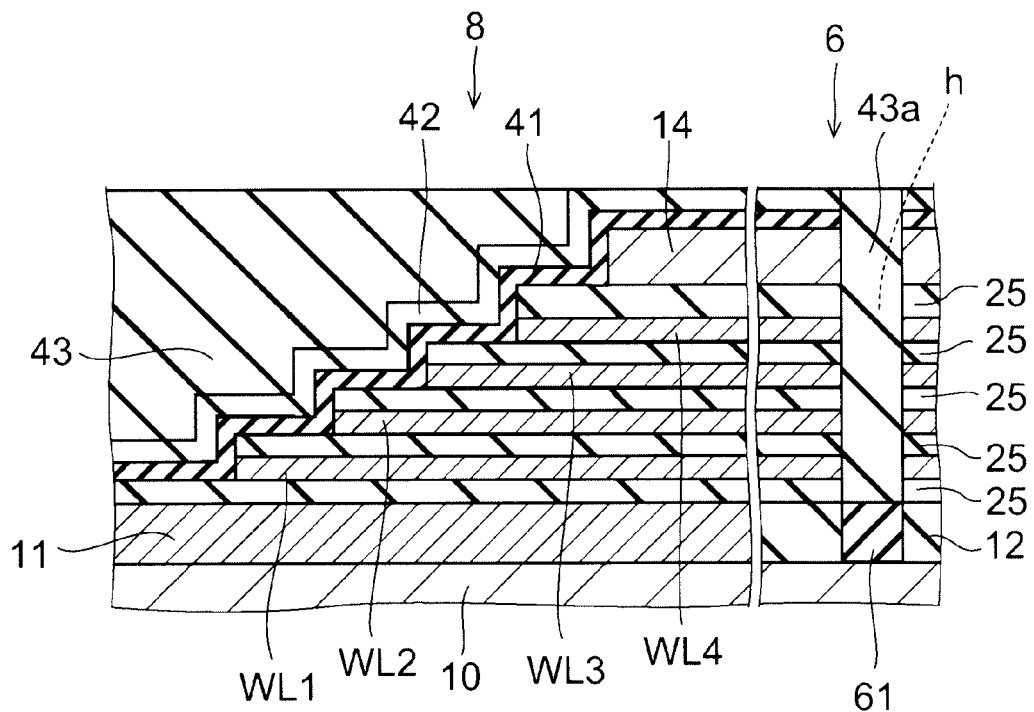

Next, the interlayer insulating layer (e.g. silicon oxide) 43 is formed on the staircase structure unit and on the stopper layer 42 in the peripheral circuit region 6, and then it is planarized by, for example, the CMP (chemical mechanical polishing) method as illustrated in FIG. 14A. The interlayer insulating layer 43 is buried in the dummy hole h formed in the peripheral circuit region 6 as the insulator 43a.

Figure 14B:
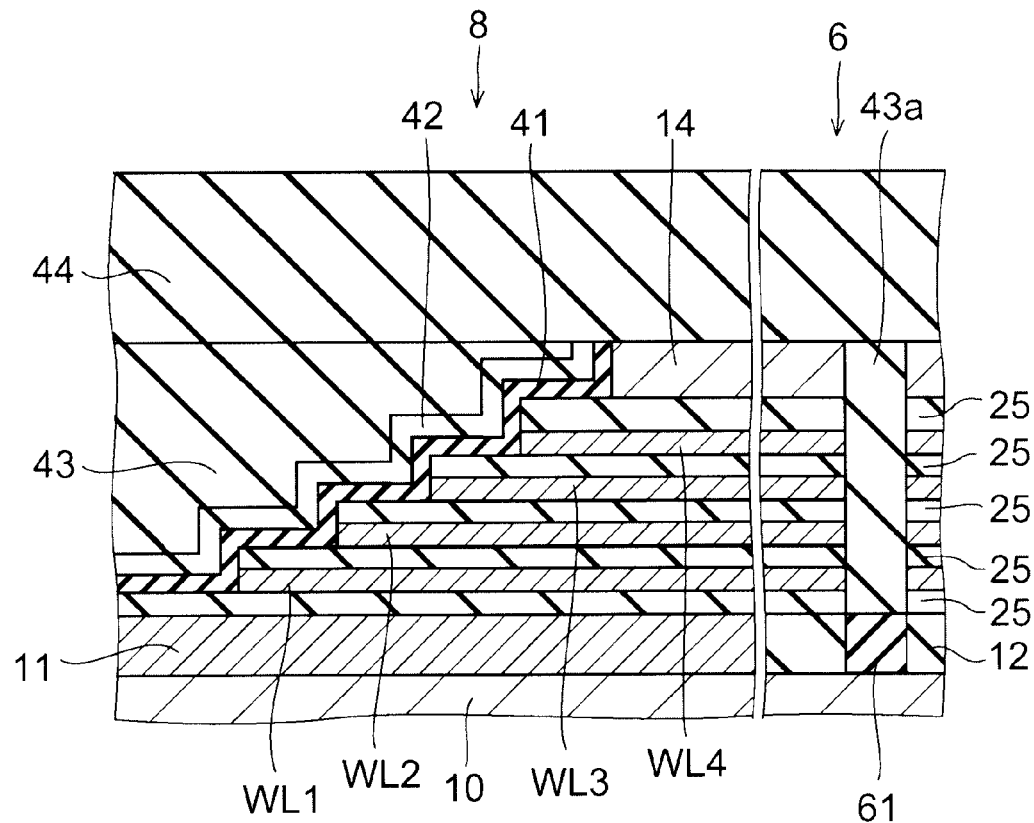

Next, the spacer layer 41 and the stopper layer 42 on the conductive layer 14 are removed by etchback, and then the interlayer insulating layer 44 is formed on the interlayer insulating layer 43, the conductive layer 14, and the insulator 43a as illustrated in FIG. 14B.

Figure 15A:
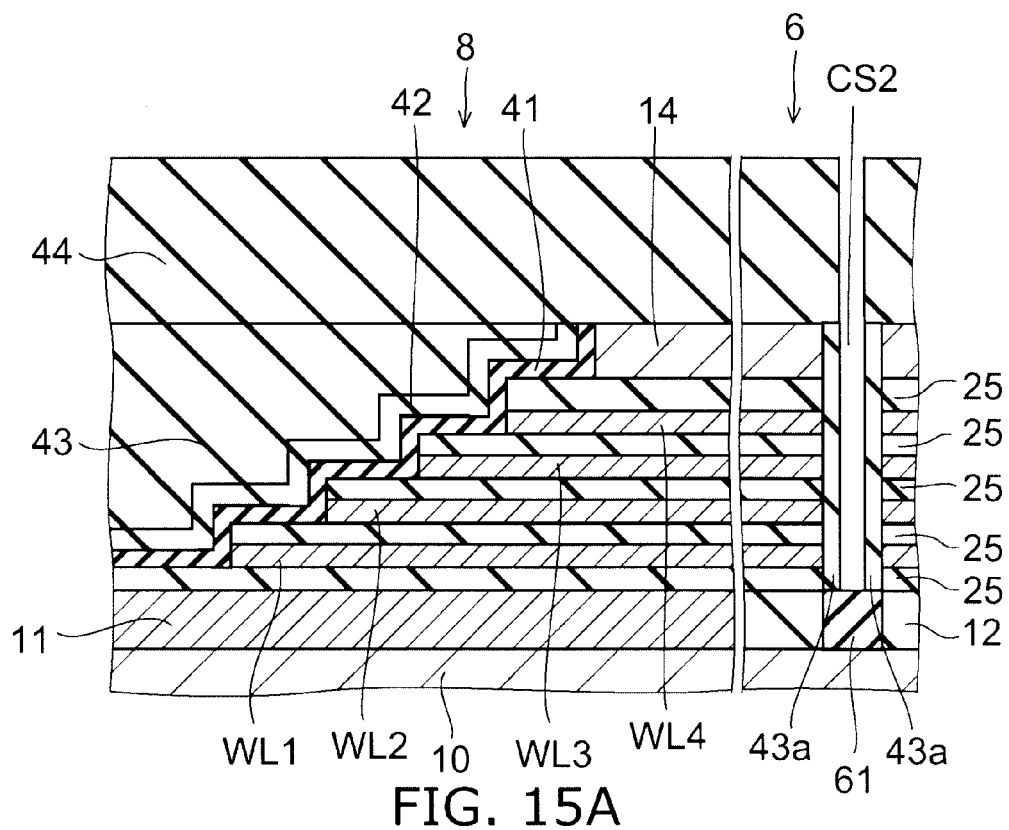

Next, as illustrated in FIG. 15A, the second contact hole CS2 is formed in the insulator 43a on the sacrificial film 61 and the overlying interlayer insulating layer 44. The second contact hole CS2 is formed by the RIE method using a not-illustrated etching mask and pierces the interlayer insulating layer 44 and the insulator 43a to reach the sacrificial film 61.

At this time, the hole diameter of the bottom of the second contact hole CS2 is made smaller than the hole diameter of the top of the first contact hole CS1 in order to prevent the second contact hole CS2 from shifting from the inside of the insulator 43a to reach the conductive layers 14 and WL1 to WL4 due to positional misalignment. Thereby, a short circuit between the contact electrode provided in the second contact hole CS2 and the conductive layers 14 and WL1 to WL4 can be certainly avoided.

Figure 15B:
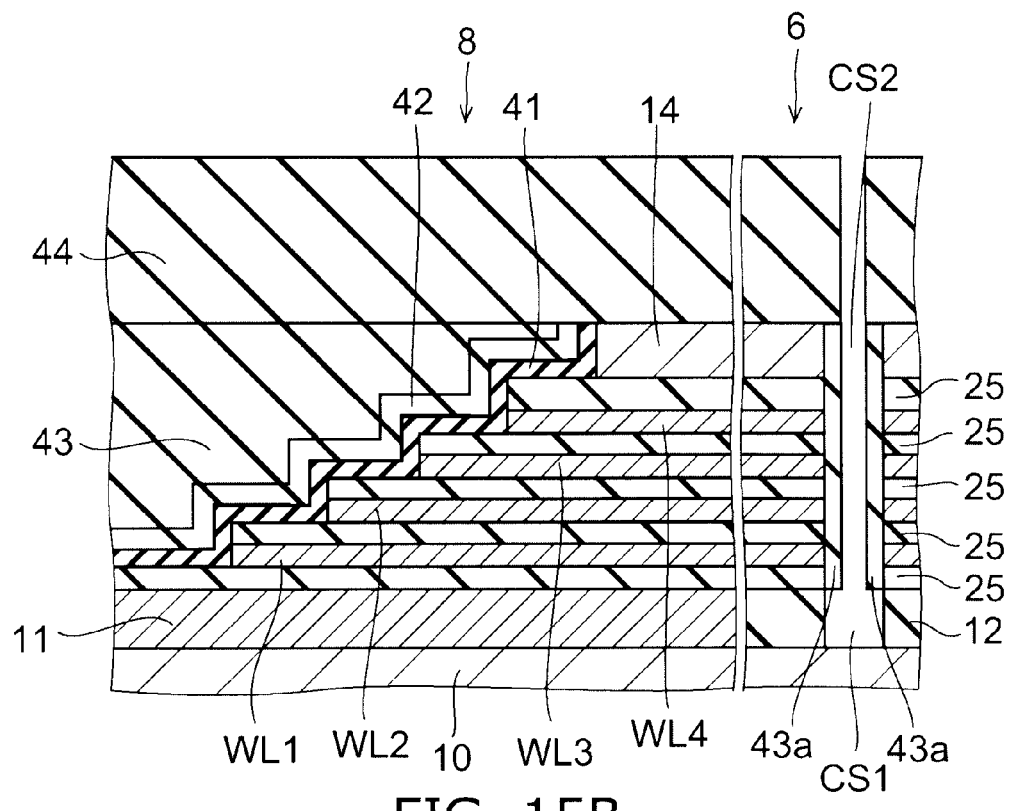

Next, the sacrificial film 61 in the first contact hole CS1 is removed via the second contact hole CS2. For example, the sacrificial film 61 that is silicon nitride is removed from the first contact hole CS1 by wet etching using hot phosphoric acid. By removing the sacrificial film 61, the first contact hole CS1 and the second contact hole CS2 are connected to each other and become a continuous hole as illustrated in FIG. 15B. The source or drain region of the peripheral circuit transistor formed on the surface of the substrate 10 is exposed at the bottom of the first contact hole CS1. After that, the contact electrode 51 is buried in the first contact hole CS1 and the second contact hole CS2.

In this embodiment, the area of the contact between the contact electrode 51 and the surface of the substrate 10 is determined by the hole diameter of the first contact hole CS1. The first contact hole CS1 has a low aspect ratio and is excellent in dimension controllability. This can suppress a variation in the area of the contact between the contact electrode 51 and the surface of the substrate 10 and eventually can suppress a characteristic variation of the peripheral circuit transistor.

Furthermore, since the first contact hole CS1 is formed in the first processing layer (the insulating layer 12) not including the plurality of conductive layers WL1 to WL4, an increase in the aspect ratio does not occur even if the number of the conductive layers WL1 to WL4 is increased in order to increase the capacity.

The second contact hole CS2 has a higher aspect ratio than the first contact hole CS1. However, since the second contact hole CS2 does not reach the surface of the substrate 10, a variation in the hole diameter thereof does not affect the area of the contact between the contact electrode 51 and the substrate 10. The second contact hole CS2 is shallow and has a low difficulty level of the processing as compared with the case where the contact holes that reach the surface of the substrate 10 from the interlayer insulating layer 44 are correctively formed by RIE.

A combination of a barrier metal such as Ti and TiN, and tungsten, for example, may be used as the contact electrode. First, the barrier metal is formed on the inner wall (side wall and bottom) of the contact hole by the CVD method. This barrier metal has a good adhesiveness with both the insulator around the contact hole and tungsten. After forming the barrier metal, tungsten, which is excellent in embeddedness, is buried on the inside of the barrier metal by the CVD method. Most part of the contact hole is configured to be filled with the tungsten.

Here, as a comparative example, a method may be possible in which the first contact electrode is buried instead of the sacrificial film 61 in the first contact hole CS1, then the second contact hole CS2 is formed thereon, and the second contact electrode is buried in the second contact hole CS2 to be connected to the first contact electrode in the first contact hole CS1.

However, in this case, the barrier metal is formed at the bottom of the second contact hole CS2, that is, on the upper surface of the first contact electrode when the second contact hole CS2 is formed on the first contact electrode and the second contact electrode is formed therein. Therefore, the barrier metal is interposed between the tungsten of the first contact electrode and the tungsten of the second contact electrode, and this may cause an increase in the resistance of the contact electrode.

In contrast, in this embodiment, the sacrificial film 61 is removed from the first contact hole CS1, and the contact electrode 51 is buried at one time in the continuous contact hole of the first contact hole CS1 and the second contact hole CS2 as illustrated in FIG. 15B. Accordingly, the barrier metal is not interposed at the interface between the first contact hole CS1 and the second contact hole CS2, and tungsten can be buried integrally in the first contact hole CS1 and the second contact hole CS2. Thus, it achieves a low resistance.

Hereinabove, embodiments are described with reference to specific examples. However, the invention is not limited thereto, and various modifications are possible based on the technical ideas of the invention.

Figure 16:
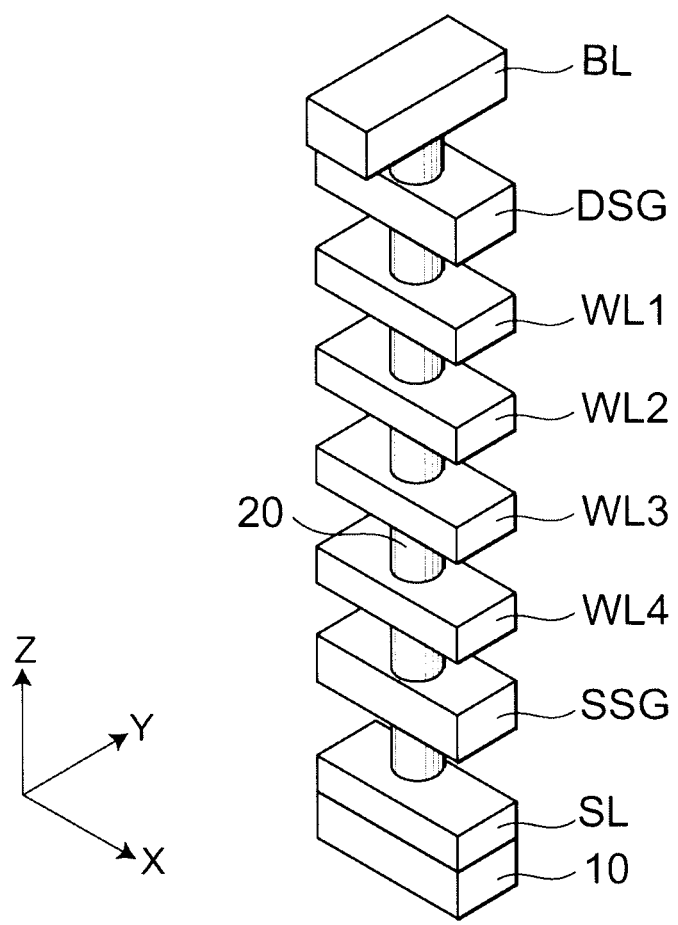
FIG. 16 is a schematic view illustrating another specific example of a memory string in a semiconductor device according to an embodiment.

The configuration of the memory string is not limited to the U-shaped configuration but may be an I-shaped configuration as illustrated in FIG. 16. FIG. 16 illustrates only conductive portions, and illustration of insulating portions is omitted. In this configuration, the source line SL is provided on the substrate 10; the source-side selection gate (or a lower selection gate) SSG is provided above the SL; the conductive layers WL1 to WL4 are provided above the SSG; and the drain-side selection gate (or an upper selection gate) DSG is provided between the uppermost conductive layer WL1 and the bit line BL.

Furthermore, the insulating film structure between the conductive layers WL1 to WL4 and the silicon body 20 is not limited to the ONO (oxide-nitride-oxide) structure but may be a two-layer structure of, for example, a charge storage layer and a gate insulating film.

Hereinabove, embodiments are described with reference to specific examples. However, the invention is not limited to those examples but various modifications are possible based on the technical idea of the invention.

The invention claimed is:

1. A method for manufacturing a semiconductor device comprising:
   forming a first layer on a substrate;
   forming a first contact hole in the first layer;
   burying a sacrificial film in the first contact hole;
   forming a second layer on the first layer and the first contact hole after burying;
   forming a second contact hole reaching the sacrificial film in the second layer;
   removing the sacrificial film from the first contact hole via the second contact hole; and
   providing a contact electrode in the first contact hole and the second contact hole, wherein forming the first layer includes stacking alternately a plurality of conductive layers and a plurality of insulating layers.

2. The method according to claim 1, wherein a hole diameter of a bottom of the second contact hole is smaller than a hole diameter of a top of the first contact hole.

3. The method according to claim 1, further comprising:
   processing a part of a stacked body including the plurality of conductive layers and the plurality of insulating layers into a staircase shape to form a staircase structure unit;
   forming an insulating film on the staircase structure unit and on a side wall of the first contact hole after the forming the first contact hole;
   forming the sacrificial film on the insulating film in the staircase structure unit and on an inside of the insulating film in the first contact hole;
   separating the insulating film in the staircase structure unit and the insulating film in the first contact hole; and
   separating the sacrificial film in the staircase structure unit and the sacrificial film in the first contact hole.

4. The method according to claim 3, further comprising forming a plurality of contact holes piercing the sacrificial film and the insulating film in the staircase structure unit to reach the respective conductive layers processed into a staircase shape after the removing the sacrificial film.

5. The method according to claim 4, wherein, an electrode of a same material as the contact electrode is formed also in each of the contact holes simultaneously with formation of the contact electrode in the first contact hole and the second contact hole after the forming the contact holes.

6. The method according to claim 1, further comprising:
   forming a memory hole piercing the plurality of conductive layers and the plurality of insulating layers in a memory cell array region in the stacked body;
   forming an insulating film including a charge storage layer on a side wall of the memory hole; and
   forming a semiconductor layer on an inside of the insulating film in the memory hole.

7. The method according to claim 1, wherein the first layer is thinner than the second layer and the first contact hole has a lower aspect ratio than the second contact hole.

8. The method according to claim 1, further comprising:
   forming a dummy hole reaching the sacrificial film in the second layer; and burying an insulator in the dummy hole, after the forming the second layers; and
   the second contact hole is formed in the insulator.

9. The method according to claim 1, wherein the forming the second layer includes stacking alternately a plurality of conductive layers and a plurality of insulating layers.

10. The method according to claim 9, further comprising:
   processing a part of a stacked body including the plurality of conductive layers and the plurality of insulating layers into a staircase shape to form a staircase structure unit;
   forming a dummy hole reaching the sacrificial film in the stacked body; and
   burying an insulator in the dummy hole,
   the second contact hole being formed in the insulator.

11. The method according to claim 10, further comprising:
   forming an interlayer insulating layer on the staircase structure unit; and forming a plurality of contact holes reaching the respective conductive layers processed into a staircase shape in the interlayer insulating layer.

12. The method according to claim 11, wherein, an electrode of a same material as the contact electrode is formed also in each of the contact holes simultaneously with formation of the contact electrode in the first contact hole and the second contact hole after the forming the contact holes.

13. The method according to claim 9, further comprising:
  forming a memory hole piercing the plurality of conductive layers and the plurality of insulating layers in a memory cell array region in the stacked body;
  forming an insulating film including a charge storage layer on a side wall of the memory hole; and
  forming a semiconductor layer on an inside of the insulating film in the memory hole.

* * * * *